United States Patent
Kim et al.

(10) Patent No.: US 9,328,286 B2
(45) Date of Patent: May 3, 2016

(54) PHOSPHOR AND LIGHT EMITTING DEVICE

(71) Applicants: LG INNOTEK CO., LTD., Seoul (KR); FORCE4 CORP., Gwangju (KR)

(72) Inventors: Choong Youl Kim, Gwangju (KR); Joong In An, Gwangju (KR); Seung Hyok Park, Daejeon (KR); Ho Shin Yoon, Gwangju (KR); Chang Hee Lee, Daejeon (KR)

(73) Assignees: LG INNOTEK CO., LTD., Seoul (KR); FORCE4 CORP., Gwangju (KR)

( * ) Notice: Subject to any disclaimer, the term of this patent is extended or adjusted under 35 U.S.C. 154(b) by 271 days.

(21) Appl. No.: 13/956,064

(22) Filed: Jul. 31, 2013

(65) Prior Publication Data

US 2013/0313966 A1 Nov. 28, 2013

Related U.S. Application Data

(63) Continuation of application No. 12/711,158, filed on Feb. 23, 2010, now Pat. No. 8,704,255.

(30) Foreign Application Priority Data

Feb. 23, 2009 (KR) .................. 10-2009-0014788

(51) Int. Cl.
H01L 27/15 (2006.01)
C09K 11/77 (2006.01)
C09K 11/65 (2006.01)
H05B 33/12 (2006.01)
H01L 33/50 (2010.01)

(52) U.S. Cl.
CPC ............. *C09K 11/7728* (2013.01); *C09K 11/65* (2013.01); *H05B 33/12* (2013.01); *H01L 33/502* (2013.01); *H01L 2224/48091* (2013.01); *H01L 2224/48247* (2013.01); *H01L 2224/8592* (2013.01)

(58) Field of Classification Search
None
See application file for complete search history.

(56) References Cited

U.S. PATENT DOCUMENTS

| 8,007,683 B2 | 8/2011 | Starick et al. |
| 2008/0251764 A1 | 10/2008 | Starick et al. |
| 2013/0313966 A1* | 11/2013 | Kim ............ C09K 11/65 313/503 |

FOREIGN PATENT DOCUMENTS

| JP | 2008-163259 A | 7/2008 |
| JP | 2008-189811 A | 8/2008 |
| KR | 10-2008-0049771 A | 6/2008 |

OTHER PUBLICATIONS

Ding, "Structure and Magnetic Properties of Iron-Based Cyanide Compounds", IEEE Transactions on Magnetics, vol. 37, No. 4, Jul. 2001, pp. 2938-2940.

(Continued)

*Primary Examiner* — Jack Chen
(74) *Attorney, Agent, or Firm* — Birch, Stewart, Kolasch & Birch, LLP

(57) ABSTRACT

A phosphor and a light emitting device containing the phosphor are provided. According to an embodiment, the phosphor is expressed in a chemical formula of $L_xM_yC_{z1}N_{z2}:A_a$ where L is at least one of an alkaline earth metal, a transition metal, Zn, Cd, Al, Ga, In, Ti, Ge, and Sn; M is at least one of B, Si, P, S, F, Cl, I, and Se; and A is at least one of an alkaline rare earth metal and the transition metal, and where $0<x\le5$, $0\le y\le5$, $1\le z1\le10$, $1\le z2\le10$, and $0<a\le1$.

8 Claims, 3 Drawing Sheets

(56) References Cited

OTHER PUBLICATIONS

Gerhardt et al., "Polarized and Time-Resolved Spectroscopy of Single Crystal Ba[Pt(CN)4] 4H20, A Pseudo-One-Dimensional System," Journal of Luminescence, vol. 18/19, No. 1, Jan. 1979, XP-001274052, pp. 357-361.

Guo, "Solvent Dependent Tunable Energy Transfer of d10 Metal Dicyanide Nanoclusters with Eu3 + and Tb3 + Rare Earth Ions", Science Digest, Chemical Physics Letters, vol. 445, 2007, pp. 340-344.

Larochelle, "Synthesis and Spectral Properties of Ce[Ag(CN)x]3", Science Digest, vol. 30, 2008, pp. 1446-1450, Elsevier.

Rodriguez-Hernandez, "Crystal Structures of Hexacyanometallates with Bifurcated Cyano Groups", Journal of Physics D. Applied Physics, vol. 40, 2007, pp. 6076-6082, IOP Publishing, United Kingdom.

Wickleder, "Photoluminescence of Ba(SCN):Eu2+", Journal of Alloys and Compounds, vol. 374, 2004, pp. 10-13.

\* cited by examiner

PHOSPHOR AND LIGHT EMITTING DEVICE

CROSS-REFERENCE TO RELATED APPLICATIONS

This application is a Continuation of copending application Ser. No. 12/711,158 filed on Feb. 23, 2010, which claims priority to Application No. 10-2009-0014788 filed on Feb. 23, 2009. The entire contents of all of the above applications is hereby incorporated by reference.

BACKGROUND

The present disclosure relates to a phosphor and a light emitting device.

Phosphors have been used together with various light emitting devices.

Generally, phosphors are used for manufacturing light emitting devices in which they are coated on a blue or near ultraviolet (UV) light emitting diode to emit white light.

However, a related art silicon nitride-based phosphor or oxynitride-based phosphor should be synthesized in a high-temperature and high-pressure environment. Also, according to the related art, it is difficult to crush phosphor powder, and a synthetic raw material (starting material) is expensive. Thus, there is a limitation that the phosphor is not prepared easily at a low cost. As a result, the fabrication costs of light emitting devices containing such phosphor are increased and the fabrication processes for the light emitting devices become more complicated.

SUMMARY OF THE INVENTION

Embodiments of the invention provide a novel phosphor and a light emitting device containing the phosphor.

Embodiments of the invention also provide a phosphor prepared at a low cost and a light emitting device containing the phosphor.

Embodiments of the invention provide a phosphor, a light emitting device containing the phosphor, and method of forming the same, which address the limitations and disadvantages associated with the related art.

In one embodiment, a phosphor is expressed in the following chemical formula: $L_xM_yC_{z1}N_{z2}:A_a$ where L is at least one of an alkaline earth metal, a transition metal, Zn, Cd, Al, Ga, In, Ti, Ge, and Sn; M is at least one of B, Si, P, S, F, Cl, I, and Se; and A is at least one of an alkaline rare earth metal and the transition metal, and where $0<x\leq5$, $0\leq y\leq5$, $1\leq z1\leq10$, $1\leq z2\leq10$, $0<a\leq1$.

In another embodiment, a light emitting device comprises: a light emitting diode chip; a substrate supporting the light emitting diode chip; electrode layers over the substrate, the electrode layers being electrically connected to the light emitting diode chip; and a phosphor excited by light generated from the light emitting diode chip, wherein the phosphor is expressed in a chemical formula of $L_xM_yC_{z1}N_{z2}:A_a$ where L is at least one of an alkaline earth metal, a transition metal, Zn, Cd, Al, Ga, In, Ti, Ge, and Sn; M is at least one of B, Si, P, S, F, Cl, I, and Se; and A is at least one of an alkaline rare earth metal and the transition metal, and where $0<x\leq5$, $0\leq y\leq5$, $1\leq z1\leq10$, $1\leq z2\leq10$, $0<a\leq1$.

In further another embodiment, a light emitting device comprises: a light emitting diode chip; a substrate supporting the light emitting diode chip; electrode layers over the substrate, the electrode layers being electrically connected to the light emitting diode chip; and a phosphor excited by light generated from the light emitting diode chip, wherein the phosphor comprises a first phosphor expressed in a chemical formula of $L_xM_yC_{z1}N_{z2}:A_a$ where L is at least one of an alkaline earth metal, a transition metal, Zn, Cd, Al, Ga, In, Ti, Ge, and Sn; M is at least one of B, Si, P, S, F, Cl, I, and Se; and A is at least one of an alkaline rare earth metal and the transition metal and where $0<x\leq5$, $0\leq y\leq5$, $1\leq z1\leq10$, $1\leq z2\leq10$, $0<a\leq1$, and a second phosphor comprising any one of a silicate-based phosphor, a sulfide-based phosphor, and a nitride-based phosphor.

The details of one or more embodiments are set forth in the accompanying drawings and the description below. Other features will be apparent from the description and drawings, and from the claims.

DETAILED DESCRIPTION OF THE EMBODIMENTS

Figure 1:
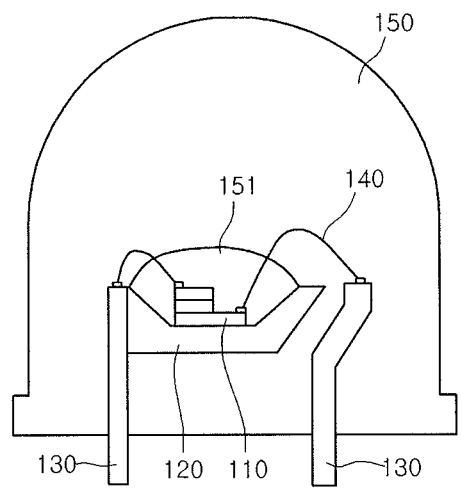
FIG. 1 is a view illustrating a structure of a light emitting device according to an embodiment of the invention.

Reference will now be made in detail to the embodiments of the present disclosure, examples of which are illustrated in the accompanying drawings.

In the drawings, the thickness or size of each layer may be exaggerated, omitted, or schematically illustrated for convenience in description and clarity. Also, the size of each element does not necessarily reflect an actual size.

FIG. 1 is a view illustrating a structure of a light emitting device according to an embodiment of the invention.

Referring to FIG. 1, a light emitting device includes a light emitting diode (LED) chip 110, a substrate 120, two or more conductive members 130, a wire 140, a sealing layer/member 150, and a phosphor 151. The substrate 150 supports the LED chip 110. The conductive members 130 are electrically separated from each other to supply power to the LED chip 110. The wire 140 electrically connects the LED chip 110 to the conductive members 130. The sealing layer 150 is preferably formed of a colorless or colored light transmission resin, which molds the LED chip 110. For instance, the sealing layer 150 encapsulates the LED chip 110 disposed on the substrate 120, the wire 140, the phosphor 151 and a part of the conductive members 130. The phosphor 151 can be dispersed into the entire sealing layer 151 or partially dispersed into the sealing layer 151. The phosphor 151 can cover the LED chip 110 entirely or in part.

Figure 2:
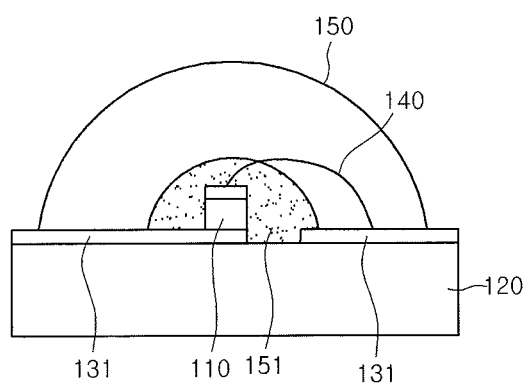
FIG. 2 is a view illustrating another structure of a light emitting device according to an embodiment of the invention.

FIG. 2 is a view illustrating another structure of a light emitting device according to an embodiment of the invention.

Referring to FIG. 2, a light emitting device includes an LED chip 110, a substrate 120, two or more electrode layers 131, a wire 140, a sealing layer/member 150, and a phosphor 151. The substrate 120 supports the LED chip 110. The electrode layers 131 are electrically separated from each other to supply power to the LED chip 110. The wire 140 electrically connects the LED chip 110 to the electrode layers 131. The sealing layer 150 is preferably formed of a colorless or colored light transmission resin, which molds the LED chip 110. For instance, the sealing layer 150 covers the LED chip 110, the wire 140, the phosphor 151 and a part of the electrode layers 131. The phosphor 151 can be dispersed into the entire sealing layer 151 or partially dispersed into the sealing layer 150. The phosphor 151 can cover the LED chip 110 entirely or in part.

In the example of the light emitting device illustrated in FIG. 2, the LED chip 110 is electrically connected to one electrode layer 131 through the wire 140. The LED chip 110 directly contacts the other electrode layer (or another of the electrode layers) 131, and thus is electrically connected to the other electrode layer 131.

Although the structure in which the LED chip 110 is connected to the electrode layer 131 (or the conductive member 130) through the wire 140 is illustrated as examples in FIGS. 1 and 2, the present invention is not limited thereto. For example, when the LED chip 110 is mounted in a flip-chip technology, the LED chip 110 may be electrically connected to the electrode layer 131 (or the conductive member 130) without requiring the wire 140.

Also, although the structure in which the phosphor 151 is disposed within (or throughout) the sealing layer 150 and disposed adjacent to the LED chip 110 is illustrated as an example in FIGS. 1 and 2, the present invention is not limited thereto. For example, the phosphor 151 may be supported by a separate film or plate, and thus disposed on a separate structure.

That is, the light emitting device illustrated in FIGS. 1 and 2 should be considered as only an illustrative example, and thus, this should not be construed as limited to the scope of the present invention. The invention encompasses any other types of light emitting devices that use phosphor therein.

Referring to FIGS. 1 and 2, the light emitting device includes the LED chip 110 to which the power is supplied and the phosphor 151 disposed on an optical path through which light generated from the LED chip 110 progresses. First light emitted from the LED chip 110 is excited by the phosphor 151 to generate second light.

For example, a GaN-based LED chip that emits light having a light emitting peak in a wavelength range of about 380 nm to about 500 nm may be used as the LED chip 110. In other examples, different types of LED chips such as a laser diode or a surface emitting diode may be used as the LED chip 110.

Although the phosphor is applied to the LED chip to manufacture the light emitting device in the above embodiments, a non-organic electroluminescent device or an organic electroluminescent device instead of an LED may be used as a light source.

The light emitting device according to an embodiment includes a light source that emits light, a substrate supporting the light source, and a sealing layer molded around the light source. The sealing layer is preferably formed of a light transmission resin. For example, the sealing layer may be formed of at least one of an epoxy resin, a silicon resin, a urea resin, an acryl resin, and a polyimide resin. The sealing layer may have a single-layered or multi-layered structure. Other phosphors except the phosphors according to an embodiment may be mixed into the phosphor 151. These features can be applied to the light emitting device of FIGS. 1 and 2.

The present invention provides a coating phosphor composition for a light emitting device containing a phosphor (e.g., phosphor 151) and a transparent resin. For example, the light emitting device of FIGS. 1 and 2 can include the coasting phosphor composition. The coating phosphor composition may be mixed at a weight ratio of about 1:2 to about 1:10.

Cyan-Based Phosphor, Method of Preparing Cyan-Based Phosphor and Method of Manufacturing Light Emitting Device Using the Cyan-Based Phosphor Cyan-Based Phosphor In FIGS. 1 and 2, the phosphor excited by the light generated from the LED chip 110 may use the following cyan-based phosphor.

The cyan-based phosphor is a phosphor expressed as in the following Chemical Formula 1:

$$L_x M_y C_{z1} N_{z2} : A_a$$ [Chemical Formula 1]

where L is at least one of an alkaline earth metal, a transition metal, Zn, Cd, Al, Ga, In, Ti, Ge, and Sn; M is at least one of B, Si, P, S, F, Cl, I, and Se; and A is at least one of an alkaline rare earth metal and the transition metal, and where $0<x\leq5$, $0\leq y\leq5$, $1\leq z1\leq10$, $1\leq z2\leq10$, $0<a\leq1$.

For example, the alkaline earth metal may include at least one of Be, Mg, Ca, Sr, Ba, and Ra. The transition metal may include at least one of Cu, Ag, Au, Sc, Y, La, Ti, Zr, V, Mn, and Ta. The alkaline rare earth metal may include at least one of Eu and Ce.

In Chemical Formula 1, the phosphor 151 according to the invention may be excited by light emitted from the light source (e.g., LED chip 110) to emit second light having a light emitting peak in a wavelength range of about 520 nm to about 680 nm according to a center wavelength of the light emitted from the light source.

Method of Preparing Cyan-Based Phosphor

The cyan-based phosphor according to an embodiment of the invention may be prepared by the following processes.

A method of preparing the cyan-based phosphor includes according to an embodiment:

(a) wet-mixing a predetermined amount of at least one of alkaline earth metal oxide, halide, carbonate, nitride, and transition metal oxide, a predetermined amount of melamine, an alkaline earth metal or a transition metal as an active agent, and halides such as $NH_4F$, $NH_4Cl$, $BaF_2$, $BaCl_2$, $CaF_2$, and $MgF_2$ as a flux under a solvent to dry the mixture for about 30 minutes to about 24 hours;

(b) placing the mixture obtained in the operation (a) into an reactor and filling an inert gas for about 30 minutes to about 5 hours from a vacuum condition of about $1\times10^{-1}$ atm to about $1\times10^{-10}$ atm up to atmospheric pressure;

(c) thermally reducing the resultant mixture at a temperature of about 500° C. to about 1,500° C. for about 1 hour to about 48 hours to cyanize the resultant mixture after the operation (b);

(d) crushing and classifying the phosphor obtained in the operation (c) to obtain phosphor powder having predetermined sizes; and (e) cleaning the phosphor powder obtained in the operation (d) to remove unreacted materials.

In the operation (a), the usage amount of each of the materials may be properly adjusted to a stoichiometric ratio to satisfy the condition of Chemical Formula 1 above.

In the operation (b), a sufficient vacuum condition is maintained to minimize a reaction between the mixture obtained in the operation (a) and oxygen. On the other hand, the inert gas may be filled from beginning without requiring the vacuum condition. However, in this case, crystals of the phosphor are not completely generated to reduce light emitting efficiency. The inert gas may be $N_2$ or Ar.

In the operation (c), a reducing heat-treatment process may be performed at a sufficient temperature for reaction completion. In this regard, when the heat-treatment temperature is less than about 500° C. under the reduction atmosphere, the crystals of the phosphor are not completely generated to reduce the light emitting efficiency. When the heat-treatment temperature is greater than about 1,500° C., an overreaction occurs to reduce luminance or prevent solid-phase phosphor powder from be generated. A gas mixture including about 2 volume % to about 100 volume % of ammonia gas and nitrogen gas may be used as reducing gas in the reducing heat-treatment process so as to cyanize the host material and reduce an active material.

In the operation (d), preferably it is necessary to perform the crush and classification processes to obtain the powder having the desired luminance and sizes because the phosphor obtained in the operation (c) may be coagulated due to a relatively high heat-treatment temperature.

In the operation (e), one or more polymer solvents, in which the unreacted materials are dissolved, such as alcohol, acetone, and polymer solvent may be used in the removing of the unreacted materials. The cleaning process may include a process in which the phosphor is placed into the polymer solvent to mix the phosphor with the polymer solvent, and then dry the resultant mixture, but the present disclosure is not limited thereto. For example, the operation (d) may be performed after the operation (e) is performed. The phosphor obtained by the heat-treatment process preferably includes a very small amount of halogen compound. When the halogen compound is not removed, moisture resistance may be deteriorate in case where the light emitting device is manufactured using the phosphor.

Specific Example 1 of Method of Preparing Cyan-Based Phosphor

In one example, 2.79 g of $BaCl_2$, 0.42 g of $EuCl_3$, and 19.22 g of $C_3N_6H_6$ are placed into acetone to mix them using a ball mill for about 1 hour. The mixture is placed into a 50° C. dryer and dried for about 1 hour to completely volatilize a solvent. The mixed material is placed into a reactor to remove oxygen within the reactor under a vacuum condition for about 1 hour, and then fill $N_2$ gas from the vacuum condition up to atmospheric pressure. $N_2$ mixture gas including about 40 volume % of $NH_3$ gas is sintered at a temperature of about 800° C. for about 3 hours while maintaining the flow of the mixture gas at 5 L/min. The heat-treated phosphor is crushed to classify the phosphor having a size easily available for a light emitting device (e.g., the light emitting device of FIGS. 1 and 2) by using powder having a size of about 20 μm. Since the classified phosphor contains unreacted materials, the phosphor is placed into a solution in which ethyl alcohol and acetone are mixed at a ratio of about 1:1 to ultrasonic-clean the phosphor for about 30 minutes, and then the cleaned phosphor is dried. As a result, the phosphor having a chemical formula of $Ba(CN)_2:Eu^{2+}$ is formed, which can be used as the phosphor 151.

Specific Example 2 of Method of Preparing Cyan-Based Phosphor

In another example, 1.38 g of $Zn(CN)_2$, 0.0069 g of CaO, 0.026 g of MnO, and 19.39 g of $C_3N_6H_6$ are placed into acetone to mix them using a ball mill for about 1 hour. The mixture is placed into a 50° C. dryer and dried for about 1 hour to completely volatilize a solvent. The mixed material is placed into a reactor to remove oxygen within the reactor under a vacuum condition for about 1 hour, and then fill $N_2$ gas from the vacuum condition up to atmospheric pressure. $N_2$ mixture gas including about 50 volume % of $NH_3$ gas is sintered at a temperature of about 800° C. for about 3 hours while maintaining the flow of the mixture gas at 2 L/min. The heat-treated phosphor is crushed to classify the phosphor having a size easily available for a light emitting device by using powder having a size of about 20 μm. Since the classified phosphor contains unreacted materials, the phosphor is placed into a solution in which ethyl alcohol and acetone are mixed at a ratio of about 1:1 to ultrasonic-clean the phosphor for about 30 minutes, and then the cleaned phosphor is dried. As a result, the phosphor having a chemical formula of $Zn(CN)_2:Mn^{2+}$ is formed, which can be used as the phosphor 151.

Example of Manufacturing Light Emitting Device Using Cyan-Based Phosphor

Referring to FIGS. 1 and 2, the phosphor having the above-described Chemical Formula 1: $L_xM_yC_{z1}N_{z2}:A_a$ where, L is at least one of an alkaline earth metal, a transition metal, Zn, Cd, Al, Ga, In, Ti, Ge, and Sn; M is at least one of B, Si, P, S, F Cl, I, and Se; and A is at least one of an alkaline rare earth metal and the transition metal, and where $0<x\le5$, $0\le y\le5$, $1\le z1\le10$, $1\le z2\le10$, $0<a\le1$, is applied to the GaN-based LED chip 110 having a light emitting peak in a wavelength range of about 500 nm to about 380 nm to manufacture the light emitting device.

Further, the phosphor 151 is mixed to the sealing layer 150 formed of a light transmission epoxy resin to surround the LED chip 110.

The phosphor 151 is excited by blue light (having a wavelength of about 450 nm) generated from the LED chip 110 to emit a second light having a center wavelength of about 520 nm to about 680 nm.

Light Emitting Properties of Cyan-Based Phosphor

Figure 3:
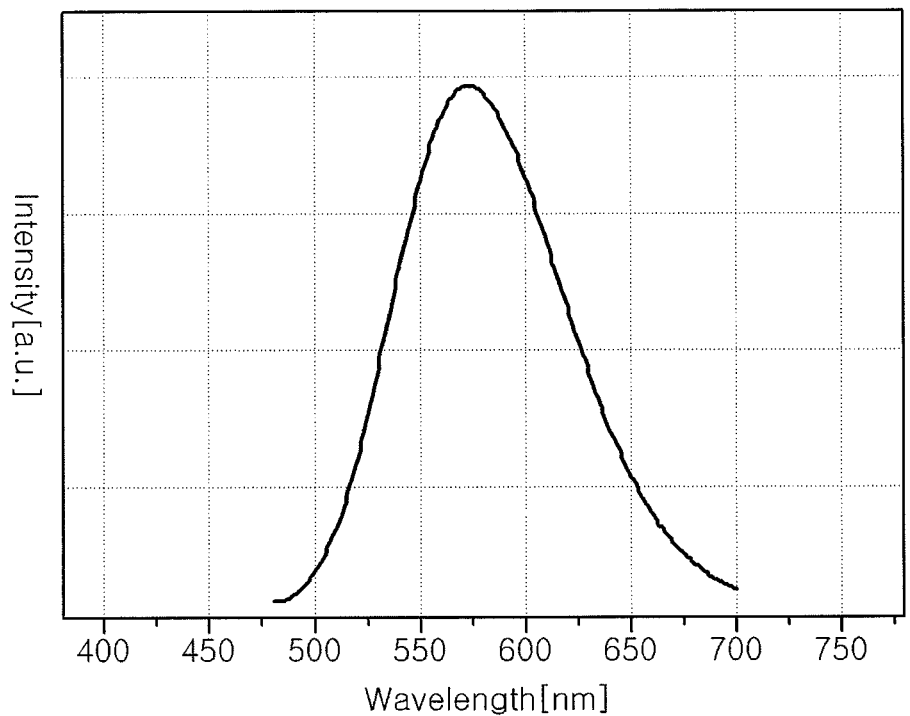
FIG. 3 is a view illustrating a light emitting spectrum of a light emitting device containing a cyan-based phosphor having a chemical formula of $Ba(CN)_2:Eu^{2+}$ according to an embodiment of the invention.
Figure 4:
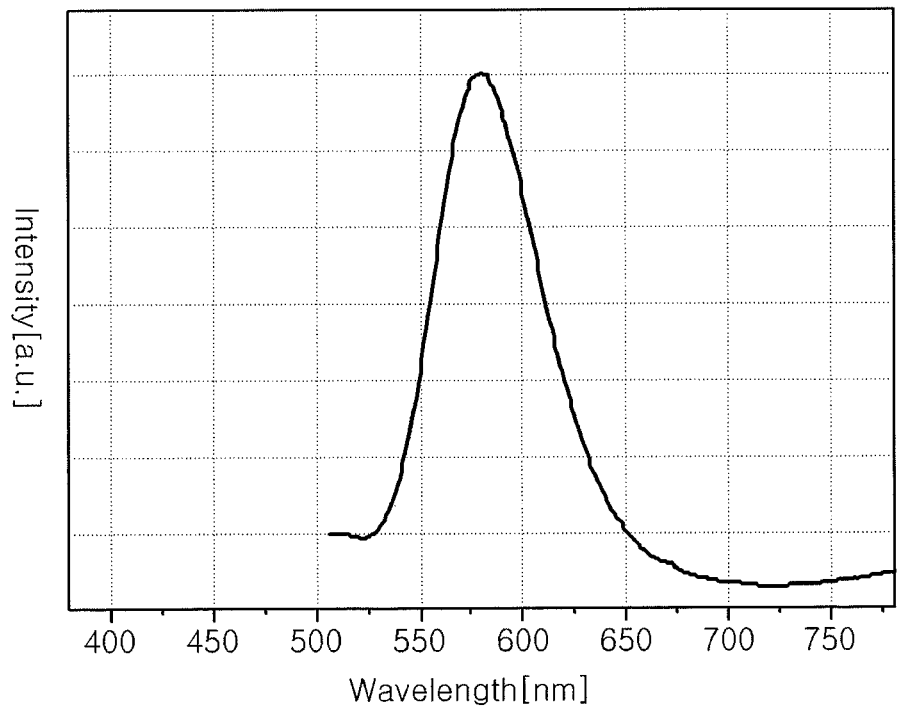
FIG. 4 is a view illustrating a light emitting spectrum of a light emitting device containing a cyan-based phosphor having a chemical formula of $Zn(CN)_2:Mn^{2+}$ according to an embodiment of the invention.

Using the two examples of the cyan-based phosphor discussed above, FIG. 3 is a view illustrating a light emitting spectrum of a light emitting device containing a cyan-based phosphor having a chemical formula of $Ba(CN)_2:Eu^{2+}$, and FIG. 4 is a view illustrating a light emitting spectrum of a light emitting device containing a cyan-based phosphor having a chemical formula of $Zn(CN)_2:Mn^{2+}$, according to an embodiment of the invention. These spectrums are equally applicable to the light emitting devices of FIGS. 1 and 2.

Referring to FIG. 3, a light emitting device including the cyan-based phosphor having the chemical formula of $Ba(CN)_2:Eu^{2+}$ prepared by the above example 1 of the method of preparing the cyan-based phosphor according to one example of the invention, is excited by an LED chip having an excitation wavelength of about 450 nm to have a light emitting peak in a wavelength range of about 520 nm to about 680 nm.

Referring to FIG. 4, a light emitting device including the cyan-based phosphor having the chemical formula of $Zn(CN)_2:Mn^{2+}$ prepared by the specific example 1 of the method of preparing the cyan-based phosphor according to another example of the invention, is excited by an LED chip having an excitation wavelength of about 450 nm to have a light emitting peak in a wavelength range of about 520 nm to about 680 nm.

The cyan-based phosphor according to an embodiment may emit light of wide wavelengths ranging from green light to red light.

The light emitting device according to an embodiment may further include a heterophosphor having a light emitting peak different from that of the cyan-based phosphor. For example, the heterophosphor may include at least one of a silicate-based phosphor, a sulfide-based phosphor, and a nitride-based phosphor, which are excited by the light generated from the LED chip to emit green light.

For example, the silicate-based phosphor may be a $Sr_2SiO_4$:Eu phosphor, the sulfide-based phosphor may be a $SrGa_2S_4$:Eu phosphor, and the nitride-based phosphor may be a β-SiAlON:Eu phosphor.

That is, the light emitting device according to embodiments of the invention may include at least one of the cyan-based phosphor, the silicate-based phosphor, the sulfide-based phosphor, and the nitride-based phosphor.

Figure 5:
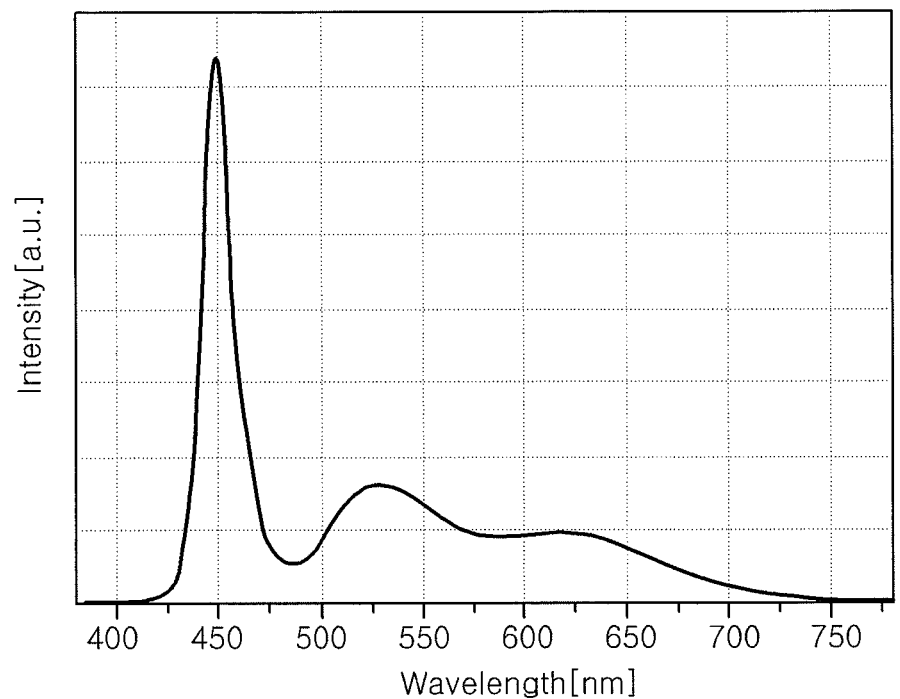
FIG. 5 is a view illustrating a light emitting spectrum of a light emitting device according to an embodiment of the invention.

FIG. 5 is a view illustrating a light emitting spectrum of a light emitting device according to an embodiment. Here, the light emitting device of FIG. 5 can be the light emitting device of FIG. 1 or 2.

Referring to FIG. 5, the light emitting device may include an LED chip emitting blue light. The phosphor may include any one or more of a cyan-based phosphor emitting red light, the silicate-based phosphor emitting light having a light emitting peak in a wavelength range of about 500 nm to about 550 nm, the sulfide-based phosphor, and the nitride-based phosphor to realize white light. That is, the phosphor of the light emitting device according to an embodiment may include a plurality of different phosphors, examples of which are discussed above. These phosphors may be mixed or layered.

The light emitting device according to an embodiment emits excitation light in which a first phosphor has a peak wavelength range of about 620 nm, and emits excitation light in which a second phosphor has a peak wavelength of about 530 nm, by the LED chip emitting a peak wavelength of about 450 nm. Thus, the light emitting device emits white light.

As described above, according to the various embodiments of the invention, since the novel phosphor is synthesized at a low-temperature and at a low-pressure and an inexpensive starting material is used, the phosphor as well as the light emitting device containing such phosphor according to the invention can be synthesized at a relatively low cost.

The light emitting device according to an embodiment may be applicable to a backlight unit, a lighting device, a display device, etc. The backlight unit, lighting device or display device includes one or more of the light emitting devices of the invention and additionally components that are commonly present in related art backlight units, light devices, or display devices. The phosphor may be disposed spaced apart from the LED chip. For example, when the light emitting device is applied to the lighting device, the LED chip and the phosphor may be supported by a separate structure, and may be separated from each other.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A phosphor expressed in a following chemical formula:

$L_xM_yC_{z1}N_{z2}:A_a$ where L is at least one selected from the group consisting of an alkaline earth metal, a transition metal, Zn, Cd, Al, Ga, In, Ti, Ge, and Sn; M is at least one selected from the group consisting of B, Si, P, S, F, Cl, I, and Se; C is carbon; N is nitrogen, and A is at least one selected from the group consisting of an alkaline rare earth metal and the transition metal, where $0<x\le5$, $y=0$, $1\le z1\le10$, $1\le z2\le10$, and $0<a\le1$ and wherein the phosphor is a cyan-based phosphor, and wherein the chemical formula is expressed as $Ba(CN)_2$:$Eu^{2+}$.

2. The phosphor according to claim 1, wherein the phosphor generates light in a wavelength range of about 520 nm to about 680 nm.

3. The phosphor according to claim 1, wherein the chemical formula is expressed as $Zn(CN)_2$:$Mn^{2+}$.

4. The phosphor according to claim 3, wherein the phosphor generates light in a wavelength range of about 520 nm to about 680 nm.

5. A light emitting device comprising:
a light emitting diode chip;
a substrate supporting the light emitting diode chip;
at least one electrode or conductive layer electrically connected to the light emitting diode chip; and
a first phosphor on the light emitting diode chip,
wherein the first phosphor is expressed in a following chemical formula:

$L_xM_yC_{z1}N_{z2}:A$ where L is at least one selected from the group consisting of an alkaline earth metal, a transition metal, Zn, Cd, Al, Ga, In, Ti, Ge, and Sn; M is at least one selected from the group consisting of B, Si, P, S, F, Cl, I, and Se; C is carbon; N is nitrogen, and A is at least one selected from the group consisting of an alkaline rare earth metal and the transition metal, where $0<x\le5$, $y=0$, $1\le z1\le10$, $1\le z2\le10$, and $0<a\le1$ and wherein the phosphor is a cyan-based phosphor, and wherein the chemical formula is expressed as $Ba(CN)_2$:$Eu^{2+}$.

6. The light emitting device according to claim 5, further comprising:
a sealing layer on the light emitting diode chip.

7. The light emitting device according to claim 6, wherein the first phosphor is at least partially dispersed in the sealing layer.

8. The light emitting device according to claim 5, further comprising a second phosphor comprising at least a material chosen in the list consisting of silicate-based phosphor, sulfide-based phosphor, and nitride-based phosphor.

* * * * *